United States Patent
Larson et al.

(10) Patent No.: US 9,263,241 B2
(45) Date of Patent: Feb. 16, 2016

(54) CURRENT THRESHOLD RESPONSE MODE FOR ARC MANAGEMENT

(75) Inventors: Skip B. Larson, Fort Collins, CO (US); Kenneth E. Nauman, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 400 days.

(21) Appl. No.: 13/104,762

(22) Filed: May 10, 2011

(65) Prior Publication Data

US 2012/0285620 A1 Nov. 15, 2012

(51) Int. Cl.
*C23C 16/00* (2006.01)
*H01J 37/32* (2006.01)

(52) U.S. Cl.
CPC ....... *H01J 37/32944* (2013.01); *H01J 37/3299* (2013.01)

(58) Field of Classification Search
CPC ............... H01J 37/32944; H01J 37/32174; H01J 2237/0203; H01J 2237/0206; H01J 2237/0209
USPC ..................................... 315/111.01; 118/715
See application file for complete search history.

(56) References Cited

U.S. PATENT DOCUMENTS

| | | | |
|---|---|---|---|
| 5,976,334 A * | 11/1999 | Fu et al. ................... | 204/298.19 |
| 6,024,844 A | 2/2000 | Drummond et al. | |
| 6,876,205 B2 | 4/2005 | Walde et al. | |
| 6,943,317 B1 * | 9/2005 | Ilic et al. .................. | 219/121.57 |
| 7,305,311 B2 * | 12/2007 | van Zyl .......................... | 702/57 |
| 7,514,935 B2 | 4/2009 | Pankratz | |
| 2008/0061794 A1 * | 3/2008 | Pankratz ....................... | 324/536 |

OTHER PUBLICATIONS

US 5,863,392, 01/1999, Drummond et al. (withdrawn)*

* cited by examiner

*Primary Examiner* — Gordon R Baldwin
*Assistant Examiner* — Charlee Bennett
(74) *Attorney, Agent, or Firm* — Neugeboren O'Dowd PC

(57) ABSTRACT

This disclosure describes systems, methods, and apparatuses for extinguishing electrical arcs in a plasma processing chamber. Once an arc is detected, the steady state voltage provided to the plasma processing chamber can be reduced, and the current being provided to the chamber decays below a steady state value as the arc is extinguished. When the current falls to or below a current threshold, the voltage can be ramped back up bringing the voltage and current back to steady state values. This technique enables power to return to a steady state level faster than traditional arc mitigation techniques.

6 Claims, 5 Drawing Sheets

CURRENT THRESHOLD RESPONSE MODE FOR ARC MANAGEMENT

FIELD OF THE INVENTION

The present invention relates generally to plasma processing. In particular, but not by way of limitation, the present invention relates to systems, methods and apparatuses for mitigating arcs in a plasma processing chamber.

BACKGROUND OF THE INVENTION

Electrical arcs can sometimes form within a plasma processing chamber and cause damage to the substrate or the chamber or can deposit particles that cause defects in a substrate. Mitigation techniques often involve shunting power away from the chamber until an arc is extinguished. While power is diverted from the chamber processing efficiency decreases, and thus quickly returning the power level to steady state is desired. At the same time, the plasma, chamber, and other elements cool while power is diverted, and thus processing efficiency does not return to steady state until these temperatures return to steady state. Thus, arc mitigation via power diversion reduces processing efficiency and throughput.

Yet, shunt time cannot be too short since arcs can flare back up or spawn new arcs if power returns before the arc is sufficiently extinguished. Since arcs decay at different rates, many techniques select a fixed shunt period that is long enough to allow all arcs to dampen to a state where it is safe to open the shunt and resume power delivery to the chamber. Yet, by fixing the shunt time according to the slowest arc decay rate, power is often shunted longer than necessary for arcs that quickly decay.

SUMMARY

This disclosure describes systems, methods, and apparatuses for mitigating arcs tailored to the decay rate of individual arcs. This process involves detecting an arc in a plasma processing chamber, reducing a voltage or power applied to the chamber, and increasing that voltage or power once a current applied to the chamber falls to or below a current threshold. The voltage can be reduced by diverting power from the plasma processing chamber, for instance by closing a shunt switch coupled between a positive and negative potential, where the positive and negative potential provide power to the plasma processing chamber. When the shunt switch is opened, current returns to the chamber and current and voltage ramp back to steady state.

Such a method can be carried out in an arc management portion of a power supply, where the arc management portion can couple a power controller to a plasma processing chamber. The arc management portion can control when power is delivered to the plasma chamber and when power is shunted or diverted away from the chamber. An arc detection module, arc reduction module, current threshold monitor, and power resumption module can mitigate arcs while tailoring the resumption of power to a decay in current applied to the chamber as the arc is extinguished.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

Rather than allow the slowest arc decay rate to dictate a shunt period, this disclosure describes systems, methods, and apparatuses for mitigating arcs tailored to the decay rate of individual arcs. Instead of shunting for a fixed period of time, shunting ends when the current provided to the plasma chamber has fallen to a level that can be considered safe for power resumption without risk of arc flare up.

Figure 1:
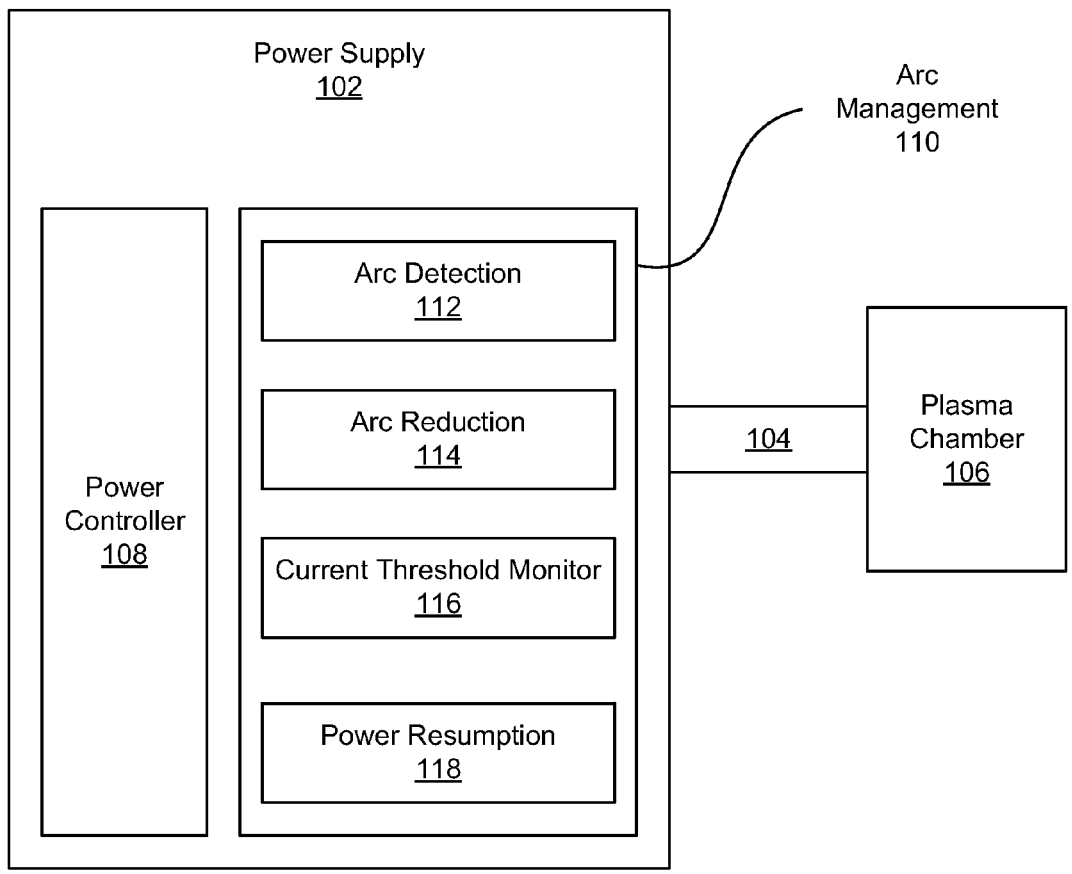
FIG. 1 illustrates an arc management portion 110 of a power supply 102 providing power to a plasma chamber 106 via a cable 104.

FIG. 1 illustrates an arc management portion 110 of a power supply 102 providing power to a plasma chamber 106 via a cable 104. The power supply 102 powers electrodes within the plasma chamber 106, via power controller 108, in order to ignite and sustain a plasma, and where the power has a steady state voltage and a steady state current. The power controller 108 can be a DC power supply, including switching components (e.g., MOSFET, FET, IGBT, etc.) and control logic for applying DC power pulses to the plasma chamber 106, where the pulses may be applied to multiple cathodes in a bi-polar manner or a single cathode in uni-polar manner.

Although the pulses applied by the power controller are referred as DC pulses, in many embodiments, the power controller 108 applies both a negative potential and a positive potential to one or more electrodes (e.g., cathodes) of the plasma chamber 106 during a power cycle (which may be between a few Hertz to several thousand Hertz). Power delivery is also controlled by the arc management portion 110 in order to prevent and mitigate arcs that form in the plasma chamber 106. This is done via an arc detection module 112, an arc reduction module 114, a current threshold monitor 116, and a power resumption module 118. The arc detection module 112 detects an arc in the plasma chamber 106, the arc reduction module 114 reduces the voltage provided to the plasma chamber 106 in response to detection of an arc, the current threshold monitor 116 monitors the current provided to the plasma chamber 106 and indicates to the power resumption module 118 to raise the voltage when the current falls below a threshold.

The illustrated arrangement of these components is logical and is not meant to be an actual hardware diagram; thus the components can be combined, further separated, and can be connected in a variety of ways without changing the basic operation of the system in an actual implementation. And although the arc management portion 110 is divided into the four components, one of ordinary skill in the art will appreciate, in light of this specification, that the functions of these components could be realized by hardware, software, firmware or a combination thereof which may be integrated or distributed among subdivided components. Moreover, the depicted components may be grouped together, deleted and/or supplemented so that more or less components can be utilized in any particular implementation. Thus, the arc management portion 110 can be embodied in several forms other than the one illustrated in FIG. 1.

Figure 3:
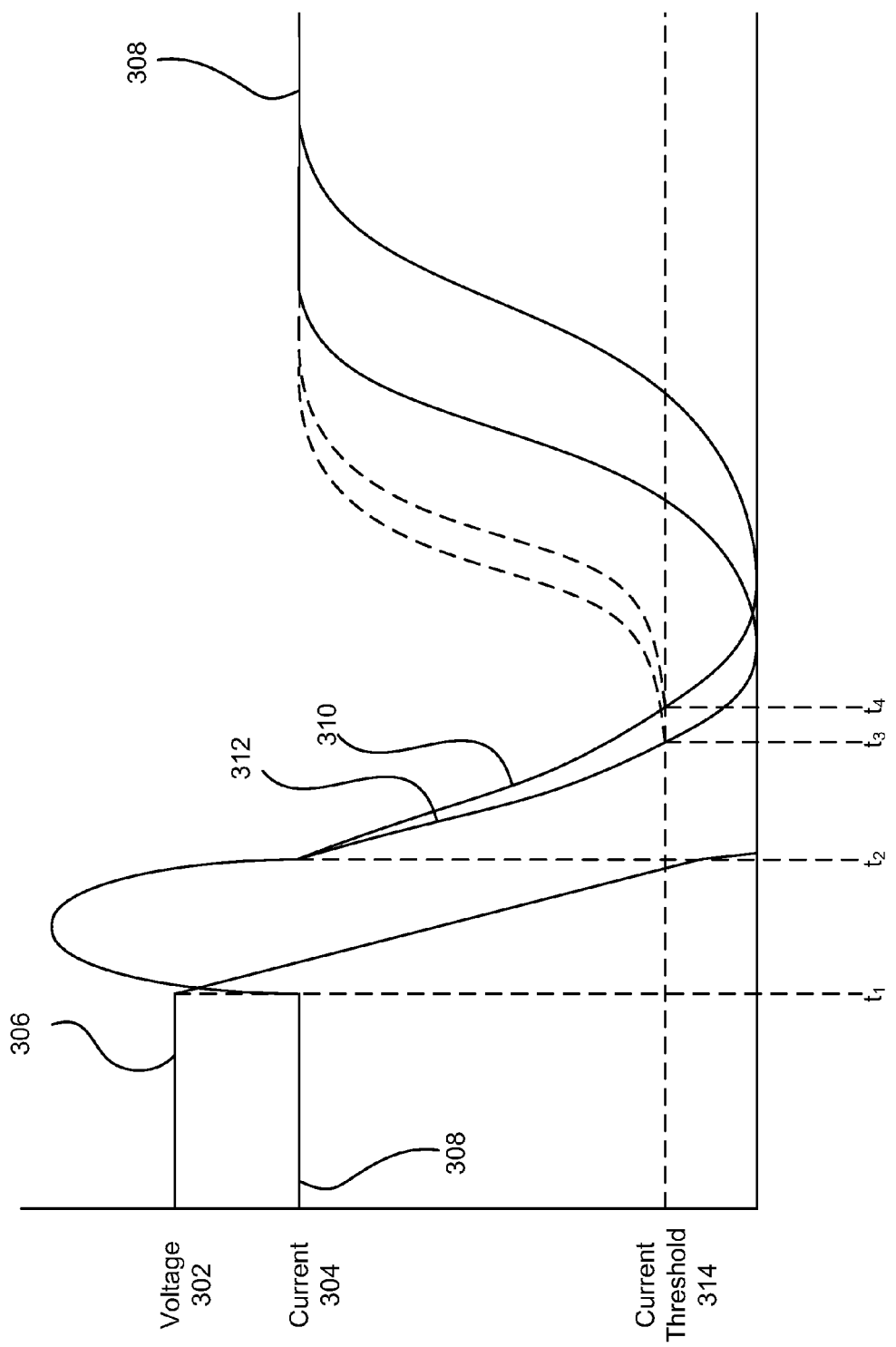
FIG. 3 illustrates an exemplary plot of voltage and current during an arc mitigation sequence.

FIG. 3 illustrates an exemplary plot of voltage and current during an arc mitigation sequence. Voltage 302 can be provided at a steady state value 306 and current 304 can be provided at a steady state value 308. An arc starts at $t_1$, creating a low impedance pathway for power within the chamber 106, thus causing the voltage 302 to drop during a period between $t_1$ and $t_2$ and causing the current 304 to rise. For example, the steady state voltage 306 may be 500V, while the voltage drops to 50 V during an arc. After the arc is detected, power is diverted from the chamber by reducing the voltage 302 to 0V starting at $t_2$. This voltage drop can be instantaneous, nearly instantaneous, or can ramp down.

But the voltage drop is accompanied by a rise in current. Thus, at $t_2$ the power can be diverted from the plasma chamber 106, via for instance closing a shunt switch. When power is diverted, the voltage drops to 0V instantaneously, or almost instantaneously. Once power is diverted, the current can decay towards 0 Amps until the arc is quenched or extinguished. The arc may be considered quenched or extinguished even where the current has not fallen to 0 Amps because resuming delivery of power to the plasma chamber 106 when the current is at the threshold 314 is unlikely to cause the arc to flare up again—it will continue to quench even as power is ramped back up. Thus, quenching or extinguishing an arc can include lowering the current to a non-zero amperage.

Each arc decays at a different rate. For instance, in the illustrated embodiment, an arc represented by the current decay 312 decays faster than the arc represented by the current decay 310. Traditionally, power is reapplied to the plasma chamber 106 after a fixed period of time from arc detection, where the time period is long enough to ensure that all arcs decay before power is reapplied. Thus, a fixed time period is starting at $t_1$ or $t_2$ is used to determine when to reapply power and ramp the voltage 302 back up (e.g., $t_4$-$t_1$). But treating all arcs the same means that power remains low even after some arcs (e.g., 312) have been extinguished (e.g., those arcs that decay quickly after power is diverted).

Rather than rely on a fixed period of time, arc management portion 110 monitors the current 304 and ramps voltage 302 after the current 304 falls to or below a current threshold 314. The current threshold 314 is illustrated as an absolute current (e.g., 1 A to 20 A)(which may be configured by a user), but the current threshold 314 can also be a percentage of the steady state current 304 (e.g., 1 A to 300 A). The current threshold 314 can be a current that is low enough that arcs can be considered 'extinguished'—that is, they are unlikely to flare up again, and new arcs are unlikely to spawn from the arc, if power is restored to the plasma chamber 106. Thus, arc management portion 110 reduces the amount of time that power is diverted from the plasma chamber 106 by ramping up voltage 302 based on the current decay of each unique arc. For instance, in the illustrated embodiment, the voltage 302 can be ramped up at $t_3$ for the arc represented by arc decay 312, and at $t_4$ for the arc represented by arc decay 310. Because power is returned as soon as the current 304 passes below the current threshold 314, current 304 returns to steady state current 308 sooner than it would under traditional methods. Thus, arc management portion 110 reduces the time during which power is diverted from the plasma chamber 106 in order to mitigate arcs.

In an embodiment, a voltage threshold rather than current threshold 314 can be used to dictate when power is delivered to the plasma chamber 306 after power has been diverted from the plasma chamber 106. For instance, when the voltage 302 falls to or below a percentage of the threshold voltage 306 or when the voltage 302 falls to or below an absolute fixed voltage, then power can be delivered to the plasma chamber 106. In an embodiment, both a voltage threshold and the current threshold 314 can be used to trigger reapplication of power to the plasma chamber 106. For instance, voltage may have to fall to or below a voltage threshold and current may have to fall to or below the current threshold 314 before power can be reapplied to the plasma chamber 106.

Returning to FIG. 1, arc management portion 110 can be hardware, software, firmware, or a combination of these, that detects and mitigates arcs in the plasma chamber 106. Although illustrated as being part of the power supply 102, the arc management portion 110 can merely communicate with the power supply 102, but otherwise be a separate component. In an embodiment, the arc management portion 110 can interface the power supply 102 to the cable 104.

The arc detection module 112 can monitor the current or voltage applied to the plasma chamber 106 and determine based on changes in either current or voltage, when an arc is occurring. In an embodiment, the arc detection module 112 is part of the power supply 102, separate from the arc management portion 110, but in communication with the arc management portion 110. In an embodiment, the arc detection module 112 includes a current sensor, current transformer, or transducer.

Once an arc is detected by the arc detection module 112, the arc reduction module 114 can reduce a voltage, current, or power applied to the plasma chamber 106. The voltage, current, or power can be reduced to a reduced level where the reduced level can be zero volts, zero amps, or zero watts, in addition to any non-zero value that is less than a steady state value. In an embodiment, the voltage applied to the plasma chamber 106 is reversed in order to more quickly extinguish the arc, and in some variations, the voltage applied to the plasma chamber 106 is reduced and then reversed.

In an embodiment, the voltage applied to the plasma chamber 106 is cut to zero, and the arc reduction module 114 can close a shunt switch to divert power from the plasma chamber 106. Closing the shunt switch quickly reduces the voltage provided to the plasma chamber 106 and opening the shunt switch quickly increases the voltage provided to the chamber 106. Arc reduction module 114 can also include flipping a voltage across a capacitor or inductor disposed between high and low voltage potentials of the power supply 102, where the high and low voltage potentials provide power to the plasma chamber 106 via cable 104. Arc reduction module 114 can be implemented in various hardware, software, and/or firmware implementations as detailed further in U.S. Pat. Nos. 7,514, 935; 6,943,317; 6,876,205; and 6,024,844, which are incorporated herein by reference The current threshold monitor 116 can monitor a current provided to the plasma chamber 106 and compare the current to a threshold. When the current falls to or below the threshold, the current threshold monitor 116 can provide a signal, data, or other indication that it is safe to return power to the plasma chamber 106. The current threshold can be less than the steady state current (e.g., the current provided to the plasma chamber 106 when there is not an arc (e.g., current 308 in FIG. 3). The current threshold can be a percentage of the steady state current (e.g., 5%), or can be an absolute fixed current (e.g., 1.0 A). The current threshold value is one at which or below which the arc can be considered extinguished (e.g., the arc is unlikely to flare up again or cause other arcs to spawn if power is reapplied to the plasma chamber 106).

When the current threshold monitor 116 detects that the current provided to the plasma chamber 106 is less than the current threshold, the power resumption module 118 can reapply the power to the plasma chamber 106. Reapplying the power may involve ramping up the power (e.g., by opening the shunt switch).

Power supply 102 in several embodiments is a DC supply for the plasma chamber 106, although even this DC supply may be pulsed at several kHz and may have zero crossings. But it is certainly contemplated that the power supply may be operated at higher frequencies; thus in some embodiments, it can be considered an AC (e.g., RF) supply. The plasma chamber 106 can be a chamber in which plasma is generated, for instance a plasma source. The source can include electrodes (e.g., that me be operated as cathodes or as cathodes and anodes) through which energy is coupled into the plasma both for igniting and sustaining the plasma. The plasma chamber 106 can also be a processing chamber (e.g., in-situ plasma generation). In an embodiment, the plasma chamber 106 may be realized as part of a remote plasma source.

The arc management portion 110 and its constituents module 112, module 114, module 116, module 118 can be implemented in hardware, software, firmware, or a combination of two or more of these. For instance, the arc management portion 110 can be a hardware component comprising circuitry and software for carrying out the functions of the arc detection module 112, arc reduction module 114, current threshold monitor 116, and power resumption module 118.

Figure 2:
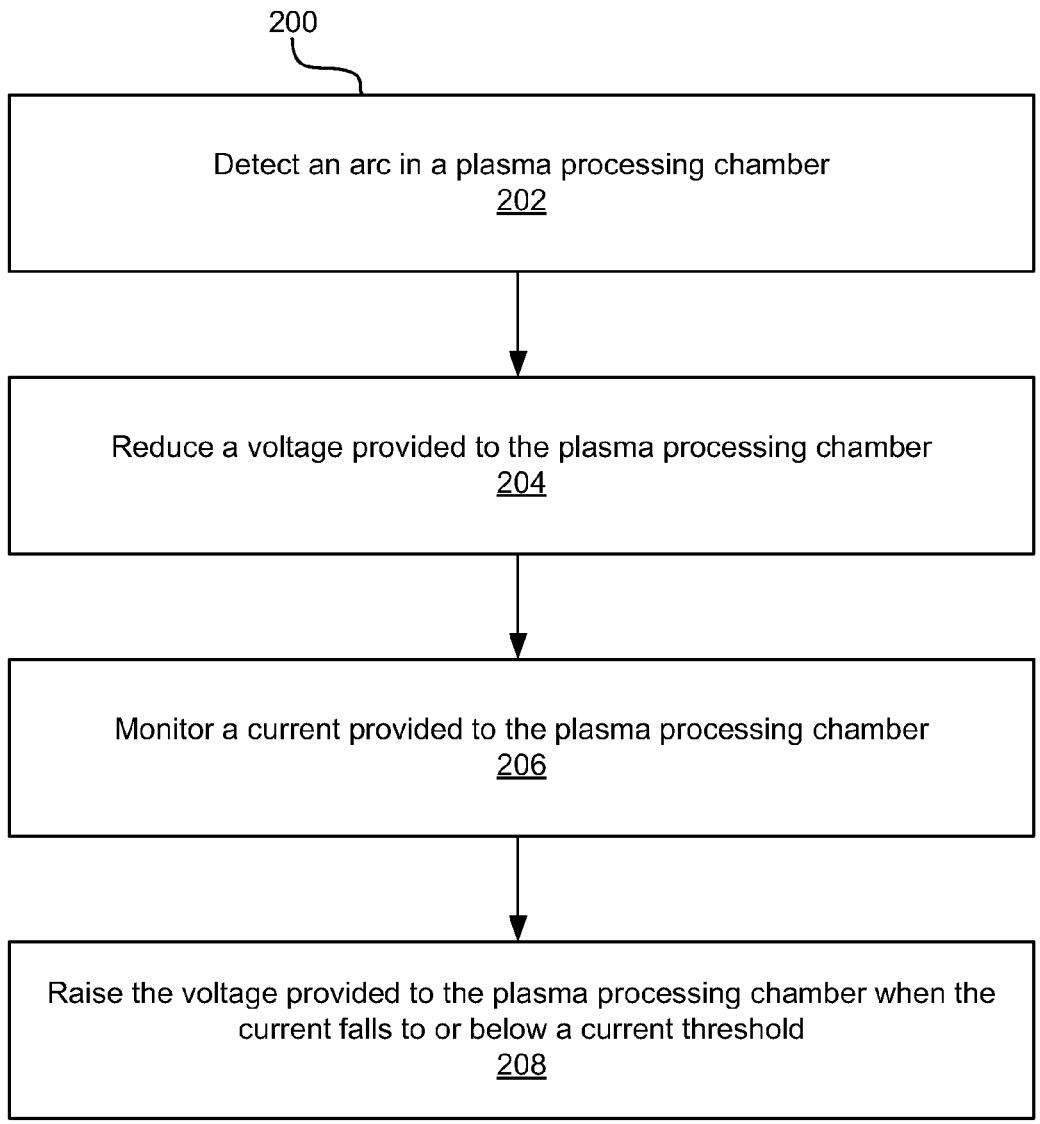
FIG. 2 illustrates a method 200 of managing arcs in a plasma chamber.

FIG. 2 illustrates a method 200 of managing arcs in a plasma chamber. The method 200 involves detecting an arc in a plasma chamber (Block 202), reducing a voltage provided to the plasma chamber in response to the arc being detected (Block 204), monitoring a current provided to the chamber (Block 206), and increasing the voltage when the current falls to, or below, a current threshold (Block 208). Compared to arc mitigation techniques that wait a fixed period of time after arc detection before increasing the voltage, and thus are not tailored to the timing of each unique arc, the method 200 increases the voltage based on the current provided to the plasma chamber. In this way, are mitigation is tailored to each arc and power is diverted from the plasma chamber for a shorter period of time, on average, than with traditional arc mitigation techniques. The method 200 can therefore increase (e.g., maximize) the amount of time that steady state power is delivered to the chamber.

The embodiments discussed with reference to FIGS. 1 and 2 can be applied to any arc mitigation circuitry, for instance those shown and described in U.S. Pat. Nos. 7,514,935; 6,943,317; 6,876,205; and 6,024,844, which are incorporated herein by reference.

Figure 4:
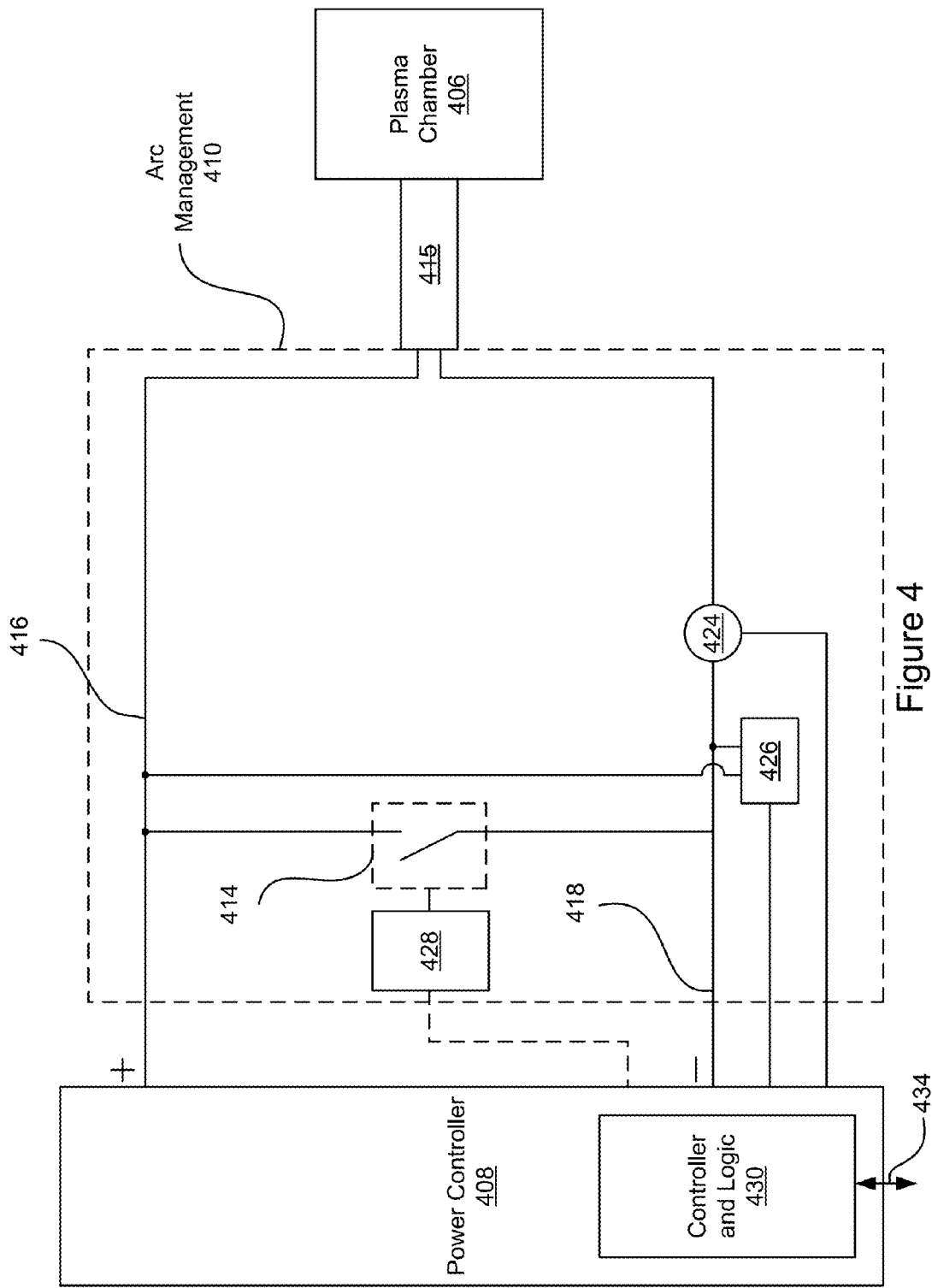
FIG. 4 illustrates a circuit-level view of an arc management portion 410.

FIG. 4 illustrates a circuit-level view of an arc management portion 410. The arc management portion 410 can be integrated (e.g., in the same housing) with the power controller 408 as part of a power supply or may be coupled externally to a power supply between the supply and the plasma chamber 406. A power controller 408 (e.g., a power converter or an inverter, to name just two examples) provides power to the plasma chamber 406 via a high voltage potential 416 and a low voltage potential 418 that couple into the arc management portion 410 so that the arc management portion 410 can control a voltage and current provided to the plasma chamber 406. The arc management portion 410 can monitor the voltage and current provided to the plasma chamber via voltage monitor 426 and current monitor 424. Based on the monitored voltage and current the arc management portion 410 can control a voltage and current provided to the plasma chamber 406 via a shunt-switch controller 428 that opens and closes a shunt switch 414.

Recalling FIG. 1, in an embodiment, arc detection module 112 can include the voltage and current monitors 426, 424 of FIG. 4. A voltage monitor can include a volt-ohm meter, an AC detector, a multimeter, or a potentiometer, to name just a few examples. The voltage monitor 426 can be coupled to the high voltage potential 416 and the low voltage potential 418 so that a potential difference between the high and low voltage potentials 416, 418 can be measured and monitored. The voltage monitor 426 can communicate the potential difference or some power control instructions, based on the potential difference to a controller and logic 430 inside the power controller 408 (and in these embodiments the controller and logic 430 is considered part of the arc management portion 410), or to circuitry that controls the shunt switch 414 such as the shunt-switch controller 428. Portions of the shunt-switch controller 428 or controller and logic 430 implemented by software or firmware may be stored on a non-transitory processor-readable medium, that may include volatile (e.g., RAM) and/or non-volatile media (e.g., ROM, NAND memory).

The current monitor 424 can measure or monitor a current by coupling in series with the high or low voltage potential 416, 418 (illustrated as coupled in series with the low voltage potential 418), and can pass information or instructions regarding this measurement to the power controller 408, the controller and logic 430, and/or the shunt-switch controller 428. The current monitor 424 can include an ammeter, a shunt resistor, hall effect current sensor transducer, transformer, or magnetoresistive field sensor, to name just a few examples. In an embodiment, the voltage and current monitors 426, 424 provide measurements of voltage and current, respectively, to the power controller 408.

In an embodiment, the arc reduction module 114 includes the shunt switch 414 and optionally the shunt-switch controller 428 of FIG. 4. The shunt switch 414 can be embodied in any number of switches including power transistors like IGBTs and MOSFETs, to name just a few examples. When an arc is detected, the shunt-switch controller 428 closes the shunt switch 414, to divert power from the plasma chamber 406. An arc may be detected, for instance, where the voltage, as measured by the voltage monitor 426, passes to or below an arc voltage threshold, and the current, as measured by the current monitor 424, rises above an arc current threshold.

In an embodiment, the arc voltage threshold and the arc current threshold can be fixed values. For example, the arc voltage threshold and the arc current threshold can be flexible values that depend on an algorithm that relates the two thresholds. For instance, if the current rises particularly steeply and surpasses not just the default arc current threshold, but also a second higher arc current threshold, then an alternative arc voltage threshold rather than the default arc voltage threshold may be used to handle such extreme arcs. In an embodiment, the shunt switch 414 can be closed when either the voltage falls to or below the arc voltage threshold or current rises above the arc current threshold. In an embodiment, there can be either an arc voltage threshold or an arc current threshold, but not both.

The shunt switch 414 can close after an arc is detected, but in other embodiments, additional circuitry, such as the shunt-switch controller 428, may allow the shunt switch 414 to close before or during the start of an arc. The opening and closing of shunt switch 414 can be controlled by the shunt-switch controller 428, which can be embodied in hardware, software, firmware, or a combination of two or more of these. The shunt-switch controller 428 may optionally be in communication with the power controller 408, and thereby in communication with the voltage monitor 426 and current monitor 424. Although not illustrated, the shunt-switch controller 428 can also be in direct communication with the voltage and current monitors 426, 424 and open and close the shunt switch 414 based on analyses of voltage and current measurements from the voltage and current monitors 426, 424. The shunt-switch controller 428 is illustrated as being a part of the arc management portion 410, but the shunt-switch controller 428 may also be part of the power controller 408 or coupled to both the power controller 408 and the arc management 410.

In an embodiment, the current threshold monitor 116 includes the current monitor 424 of FIG. 4. The current monitor 424 can monitor a current delivered to the plasma chamber 406 to determine when it is safe to open the shunt switch 414. A safe time to open the shunt switch 414 may correspond to a current level at which the resumption of power delivery to the plasma chamber 406 is unlikely to inflame the arc or spawn additional arcs. Such a current level can be a current threshold 314 as described with reference to FIG. 3. When the current monitor 424 detects that the current is equal to or has fallen below the current threshold 314, the shunt switch 414 can be reopened thus stopping the diversion of power from the plasma chamber 406.

In an embodiment, the power resumption module 118 includes the shunt switch 414 and optionally the shunt-switch controller 428 of FIG. 4. The shunt-switch controller 428 can close the shunt switch in order to divert power from the plasma chamber 406, and open the shunt switch 414 in order to stop the diversion of power from the plasma chamber 406. In an embodiment, the shunt-switch controller 428 opens the shunt switch 414 after a time period has elapsed from arc detection or closing of the shunt switch 414, and the current has fallen to or below the current threshold. However, the time period can be set to a very short time such that the time period always elapses after an arc is detected and before the current falls to or below the current threshold. As such, the current threshold effectively dictates when the shunt switch 414 opens after an arc is detected independent of the time period.

The power controller 408 can include controller and logic 430 acting as an interface to a user. For instance, the controller and logic 430 can have a user input-output 434 coupled to a keyboard, display, printer, touchscreen, pointing device (e.g., mouse), or any one or more other user input/output devices (not illustrated). Users can interface with the controller and logic 430 to control power delivery to the plasma chamber 406 and set thresholds such as the arc current threshold, arc voltage threshold, current threshold, and time period between closing and opening of the shunt switch 414, to name just a few examples. The controller and logic 430 can be implemented in hardware, software, firmware, or a combination of two or more of these. Those portions of the controller and logic 430 implemented by software or firmware may be stored on a non-transitory processor-readable medium, that may include volatile and/or non-volatile media.

Figure 5:
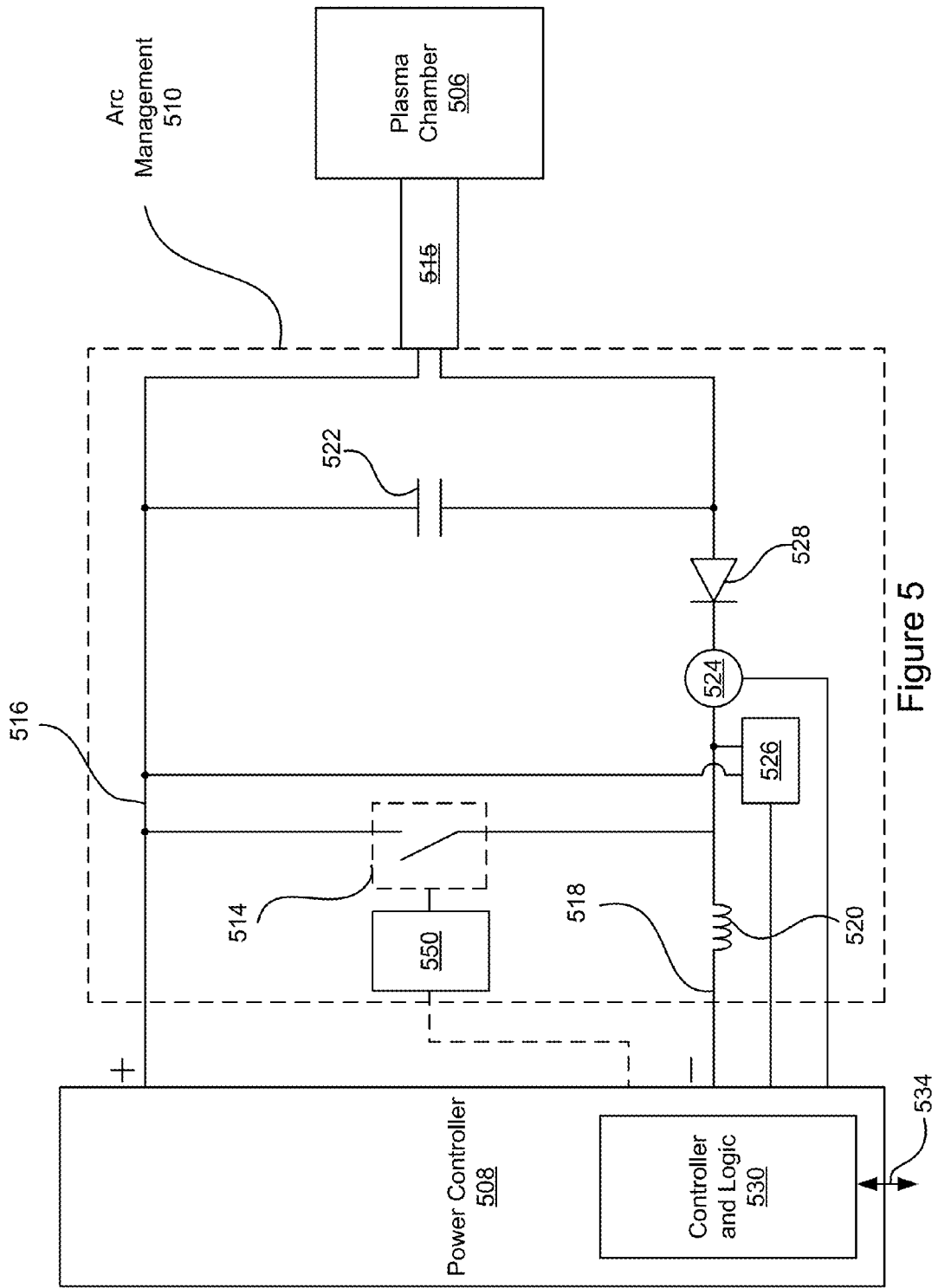
FIG. 5 illustrates another circuit-level embodiment of arc management portion 510.

FIG. 5 illustrates another circuit-level embodiment of arc management portion 510. The arc management portion 510 is again coupled between the power controller 508 (e.g., a power converter or an inverter, to name just two examples) and the plasma chamber 506 in order to monitor for arcs and control diversion of power from the plasma chamber 506 in order to mitigate detected arcs. However, in addition to the shunt switch 514, the shunt-switch controller 550, the voltage monitor 526, and the current monitor 524, the arc management portion 510 also includes a series filter inductor 520, a series diode 528, and a filter capacitor 522.

The series inductor 520 provides current sourcing capability and can act as a low-pass filter to reduce ripple currents. The series diode 528 enables the capacitor 522 to ring and thus reverse a voltage across the plasma chamber 506.

Recalling FIG. 1, in an embodiment, the arc power resumption module 118 includes the shunt switch 514, optionally the shunt-switch controller 550, and the filter capacitor 522 of FIG. 5. The filter capacitor 522 can be charged during steady state operation, such that when an arc is detected and the shunt switch 514 diverts power from the plasma chamber 506, the capacitor 522 discharges in order to reverse a voltage across the plasma chamber 506 and thereby more quickly quench the arc.

In an embodiment, the arc management portion 510 can include optional circuits, for instance a clamp circuit (not illustrated) coupled between the high and low voltage potentials 516, 518. In an embodiment, circuitry can be included to more quickly quench the arc. For instance, U.S. Pat. No. 7,514,935 uses a parallel combination of a switch and capacitor coupled in series to either the positive or negative voltage potentials 516, 518 to charge the capacitor using energy from the cable during an arc, and thereby more effectively quench the arc.

The shunt switch 514 can close after an arc is detected, but in other embodiments, additional circuitry, such as the shunt-switch controller 550, may allow the shunt switch 514 to close before or during the start of an arc. The opening and closing of the shunt switch 514 can be controlled by the shunt-switch controller 550, which can be embodied in hardware, software, firmware, or a combination of two or more of these. The shunt-switch controller 550 may optionally be in communication with the power controller 508, and thereby in communication with the voltage monitor 526 and current monitor 524. Although not illustrated, the shunt-switch controller 550 can also be in direct communication with the voltage and current monitors 526, 524 and open and close the shunt switch 514 based on analyses of voltage and current measurements from the voltage and current monitors 526, 524. The shunt-switch controller 550 is illustrated as being a part of the arc management portion 510, but the shunt-switch controller 550 may also be part of the power controller 508 or be a part of both the power controller 508 and the arc management portion 510. Portions of the shunt-switch controller 550 implemented by software or firmware may be stored on a non-transitory processor-readable medium, that may include volatile (e.g., RAM) and/or non-volatile media (e.g., ROM, NAND memory).

The power controller 508 can include controller and logic 530 acting as an interface to a user. For instance, the controller and logic 530 can have a user input-output 534 coupled to a keyboard, display, printer, touchscreen, pointing device (e.g., mouse), or any one or more other user input/output devices (not illustrated). Users can interface with the controller and logic 530 to control power delivery to the plasma chamber 506 and control thresholds such as the arc current threshold, arc voltage threshold, current threshold, and time period between closing and opening of the shunt switch 514, to name just a few examples. The controller and logic 530 can be implemented in hardware, software, firmware, or a combination of two or more of these. Those portions of the controller and logic 530 implemented by software or firmware may be stored on a non-transitory processor-readable medium, that may include volatile and/or non-volatile media.

In conclusion, the present invention provides, among other things, a method, system, and apparatus that enables arc mitigation while reducing the time during which power is diverted from the plasma chamber. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A power supply comprising:

a power controller configured to apply DC or pulsed DC power to a plasma processing chamber;

an arc management portion arranged between the power controller and the plasma processing chamber, the arc management portion including a shunt switch, a diode, and a filter capacitor, the shunt switch and the capacitor being arranged in parallel and arranged between high and low voltage potentials, the diode is coupled to the low voltage potential in series between the shunt switch and filter capacitor and having a cathode of the diode coupled to the filter capacitor and an anode of the diode coupled to the shunt switch such that the capacitor charges during steady state operation and discharges in order to reverse a voltage across the plasma processing chamber when the shunt switch closes, the arc management portion further comprising a non-transitory, tangible computer readable storage medium, encoded with processor readable instructions to extinguish one or more arcs in the plasma processing chamber, the instructions including instructions for:

detecting an arc in the plasma processing chamber;

closing the shunt switch and at least partially discharging the capacitor to reduce, responsive to detection of the arc, a voltage provided to the plasma processing chamber to at least one reduced level;

monitoring a current provided by the power supply to detect when the current falls to a current threshold that is a percentage of a steady state current being applied to the plasma processing chamber just before the arc, and where the current threshold is less than the steady state current; and opening the shunt switch to raise, from the at least one reduced level, the voltage provided to the plasma processing chamber when the current falls to the current threshold, thereby effecting a dynamic quench period having a duration dependent upon the current.

2. A power supply comprising:

a power controller configured to apply DC or pulsed DC power to a plasma processing chamber;

an arc detection module configured to detect an occurrence of an arc in the plasma processing chamber;

arc reduction circuitry arranged between the power controller and the plasma processing chamber, the arc reduction circuitry including a shunt switch, a diode, and a filter capacitor, the shunt switch and the capacitor being arranged in parallel and arranged between high and low voltage potentials, the diode is coupled to the low voltage potential in series between the shunt switch and filter capacitor and having a cathode of the diode coupled to the filter capacitor and an anode of the diode coupled to the shunt switch such that the capacitor charges during steady state operation and discharges in order to reverse a voltage across the plasma processing chamber when the shunt switch closes;

an arc reduction module configured to reduce, responsive to the occurrence of the arc, a level of the power that is applied to the plasma processing chamber by closing the shunt switch and at least partially discharging the capacitor;

a current threshold monitor configured to detect when a current level of the power supply falls to a fixed current threshold that is a percentage of a steady state current and less than the steady state current, detection occurring during reduction of the level of the power; and a power resumption module configured to terminate a dynamic quench period by increasing the level of the power to the plasma processing chamber when the current that is applied to the plasma processing chamber falls to the current threshold by opening the shunt switch.

3. The power supply of claim 2, wherein the arc detection module includes a voltage monitor and a current monitor.

4. The power supply of claim 2, wherein the arc reduction module includes a shunt switch disposed between a high and low voltage potential, wherein the shunt switch diverts power from the plasma processing chamber when closed, and wherein the high and low voltage potential provide power from the power controller to the plasma processing chamber.

5. The power supply of claim 4, wherein the arc reduction module includes a shunt-switch controller that controls closing and opening of the shunt switch.

6. The power supply of claim 5, wherein the power resumption module uses the shunt-switch controller to open the shunt switch when the current provided to the plasma processing chamber falls to the current threshold.

* * * * *